(12) United States Patent
Takikawa et al.

(10) Patent No.: US 10,566,837 B2
(45) Date of Patent: Feb. 18, 2020

(54) POWER SUPPLY DEVICE

(71) Applicant: FUJI CORPORATION, Chiryu (JP)

(72) Inventors: Shinji Takikawa, Nagoya (JP); Masaru Saito, Fussa (JP)

(73) Assignee: FUJI CORPORATION, Chiryu (JP)

( * ) Notice: Subject to any disclaimer, the term of this patent is extended or adjusted under 35 U.S.C. 154(b) by 510 days.

(21) Appl. No.: 15/325,731

(22) PCT Filed: Jul. 17, 2014

(86) PCT No.: PCT/JP2014/069027
§ 371 (c)(1),
(2) Date: Jan. 12, 2017

(87) PCT Pub. No.: WO2016/009525
PCT Pub. Date: Jan. 21, 2016

(65) Prior Publication Data
US 2017/0163090 A1     Jun. 8, 2017

(51) Int. Cl.
*B23P 19/00*     (2006.01)
*H02J 50/10*     (2016.01)
*H05K 13/02*     (2006.01)

(52) U.S. Cl.
CPC .............. *H02J 50/10* (2016.02); *H05K 13/02* (2013.01)

(58) Field of Classification Search
CPC . H02J 50/10; H05K 13/0419; H05K 13/0885; H05K 13/0417; H05K 13/04; H05K 13/02; H02M 3/04; H02P 31/00; Y10T 29/4913; Y10T 29/53174
USPC .................................................. 29/832, 739
See application file for complete search history.

(56) References Cited

U.S. PATENT DOCUMENTS 9,400,295 B2 *   7/2016   Li ..................... G06F 1/3203
9,831,720 B2 *   11/2017   Takikawa ............... H02J 17/00

FOREIGN PATENT DOCUMENTS

JP     2006-313806 A    11/2006
JP     2008-98355 A     4/2008

OTHER PUBLICATIONS

International Search Report dated Oct. 7, 2014 in PCT/JP2014/069027 filed Jul. 17, 2014.

* cited by examiner

*Primary Examiner* — Donghai D Nguyen
(74) *Attorney, Agent, or Firm* — Oblon, McClelland, Maier & Neustadt, L.L.P.

(57) ABSTRACT

An electric power supply device for supplying electric power from a supply side device to a receiver side device including a mechanism section that operates intermittently with a drive voltage and a receiver side control section that controls an operation of the mechanism section with a control voltage that is lower than the drive voltage, the electric power supply device including: a regulator section, which is provided on the receiver side device, that converts a received voltage received via an electric power supply into the control voltage; a supply voltage adjusting section, which is provided on the supply side device, that adjustably supplies the received voltage; and a supply side control section, which is provided on the supply side device, that controls the received voltage by controlling the supply voltage adjusting section.

10 Claims, 6 Drawing Sheets

POWER SUPPLY DEVICE

TECHNICAL FIELD

The present application relates to a power supply device that supplies electric power from a supply side device to a receiver side device provided with a mechanism section that operates intermittently with a drive voltage, and a control section that operates continuously with a control voltage that is lower than the drive voltage.

BACKGROUND ART

Board work machines such as solder printers, component mounters, reflow ovens, and board inspection machines are used to produce boards mounted with many components. These board work machines are often connected to each other to form a board production line. Among this equipment, component mounters provided with a board conveyance device, a component supply device, a component transfer device, and a control device are typical. A typical example of a component supply device is a feeder device that feeds tape in which many electronic components are stored at a specified pitch. Feeder devices are flat and thin in the width direction, and typically multiple feeder devices are arranged in a row on a base of the component mounter.

As an attachment construction for multiple feeder devices, a direct attachment construction and a pallet attachment construction are used. With a direct attachment constructions, component supply devices are directly attached on the base. With a pallet attachment construction, a removable pallet member provided between the base and the multiple feeder devices is used. Feeder devices have a motor in a mechanism that supplies components, and also a component supply control section that controls operation of the motor. The component supply control section is linked to a control device on the main body side of the component mounter via a communication link or the like, and exchanges commands and replies and so on.

Conventionally, contact-type electric power supply multi-terminal connectors are used for supplying electricity to the feeder device from the main body of the component mounter. However, with multi-terminal connectors, there is a problem of terminals being deformed or damaged due to repeated detachment and attachment. As a countermeasure to this, in recent years, use of contactless electric power supply devices has progressed. The motor of a feeder device operates to supply a new component when a component has been used, thus operation is intermittent. However, in spite of this, if electric power is always supplied to the motor, with both a configuration that uses a contact type electric power supply and a configuration that uses a contactless electric power supply, there is a problem that the electric power loss increases and the efficiency drops. Also, there are problems such as that, if the temperature of a feeder device increases due to heat caused by electric power loss, it is more likely that static electricity will occur at the tape in which components are stored, or, as a countermeasure to the rising temperature, it becomes necessary to provide a cooling mechanism or to make the feeder device large in order to curtail the temperature increase. The technology disclosed in patent literature 1 and 2 is proposed as a countermeasure to these problems.

With the technology of patent literature 1, a component supply device provided with a motor is also provided with a memorizing means that stores in advance a component loading schedule based on a production program, a determining means that determines the length of a period for which no component supply is scheduled based on the progress of the component loading schedule, and a control device that sets the motor to an energy saving mode (for example, a mode in which supply of electric power is cut off) when it is determined that the length of the period in which no component supply is scheduled is longer than a specified period. According to this, it is possible to curtail electric power consumption without making the device complex.

Also, the electronic component mounting device of patent literature 2 is provided with multiple driving power supply circuits that supply driving power individually to multiple work modules, a circuit disconnecting and connecting means that disconnects and connects driving power circuits except for a specified driving power circuit, and a control device that stops supply of driving power to work modules except for a specified work module by controlling the circuit disconnecting and connecting means based on predetermined driving power supply control conditions. According to this, it is possible to stop supply of driving power to a work module except for a specified module for specified conditions, thereby eliminating power loss caused by standby electric power, air leaks and the like, thus contributing to energy efficiency.

CITATION LIST

Patent Literature

Patent Literature 1: JP-A-2008-98355
Patent Literature 2: JP-A-2006-313806

SUMMARY

However, for conventional feeder devices, generally, the control voltage at which the component supply control section operates is lower than the drive voltage at which the motor operates. Thus, feeder devices operate by receiving received voltage approximately equal to the drive voltage in order to directly drive the motor, and converting the received voltage into control voltage in order to operate the component supply control section. However, the in-built regulator used to convert the voltage suffers from lowered conversion efficiency and increased electric power loss the greater the difference between the received voltage and the control voltage. Here, because the motor only operates intermittently, it is not necessary to supply electricity all the time, it is sufficient to supply electricity only during operation. On the other hand, the component supply control section must always receive a supply of electric power and must operate continuously.

As above, the operating voltages of the motor and the component supply control section are different, and there is a difference in operation between intermittent operation and continuous operation. The technology of patent literature 1 and 2 cannot be said to be definitely effective for reducing the electric power loss and heat loss of a feeder device with a regulator and two types of electric load. For example, even if a motor is controlled in an energy-saving mode by a control means as disclosed in patent literature 1, the electric power loss of the regulator is not reduced. Further, it is difficult to apply the technology of patent literature 1 and 2 with respect to a configuration that supplies electricity to a feeder device using contactless electric power supply. For example, when stopping supply of driving power to a feeder device using the control means disclosed in patent literature 2, if contactless electric power supply is stopped, the component supply control section ceases to operate.

Note that use of a contactless electric power supply method and a contactless electric power supply device is not limited to a feeder device of a component mounter; use may be applied to a wide range of fields such as other types of board work machines and processing machines and assembly machines that produce other goods.

The present disclosure takes account of such problems with conventional technology, and an object thereof is to provide an electric power supply device that effectively reduces electric power loss and temperature increase while maintaining reliable operation of a receiver side device when supplying electric power from a supply side device to a receiver side device with a mechanism section that operates intermittently by a high drive voltage, and a control section that operates continuously by a low control voltage.

In order to solve the above problems, the disclosure is an electric power supply device for supplying electric power from a supply side device to a receiver side device including a mechanism section that operates intermittently with a drive voltage and a receiver side control section that controls an operation of the mechanism section with a control voltage that is lower than the drive voltage, the electric power supply device including: a regulator section, which is provided on the receiver side device, that converts a received voltage received via an electric power supply into the control voltage; a supply voltage adjusting section, which is provided on the supply side device, that adjustably supplies the received voltage; and a supply side control section, which is provided on the supply side device, that controls the received voltage by controlling the supply voltage adjusting section; wherein the supply side control section grasps a mechanism operating time period for which operation of the mechanism section is possible, allows operation of the mechanism section during the mechanism operating time period by approximately matching the received voltage to the drive voltage, and lowers the received voltage below the drive voltage for a control operation time period, which is a time period except for the mechanism operating time period.

Advantageous Effects

According to the present disclosure, the supply side control section allows operation of the mechanism section during the mechanism operating time period by approximately matching the received voltage to the drive voltage, and lowers the received voltage below the drive voltage for a control operation time period, which is a time period except for the mechanism operating time period. Thus, for the mechanism operating time period, during which the mechanism section may operate, the receiver side device receives high received voltage approximately the same as the drive voltage, meaning that the mechanism section and the receiver side control section operate reliably. On the other hand, during the control operating time period, during which the mechanism section does not operate, the receiver side device receives low received voltage, such that the control section operates reliably. Here, because the difference between the received voltage and the control voltage is small during the control operating time period, the converting efficiency of the regulator improves, and the electric power loss and temperature increase of the receiver side device are effectively reduced. Further, due to the temperature increase being effectively decreased, the cooling configuration of heat dissipation fins and the like can be simplified, and the receiver side device can be made smaller and lighter.

DESCRIPTION OF EMBODIMENTS

Figure 1:
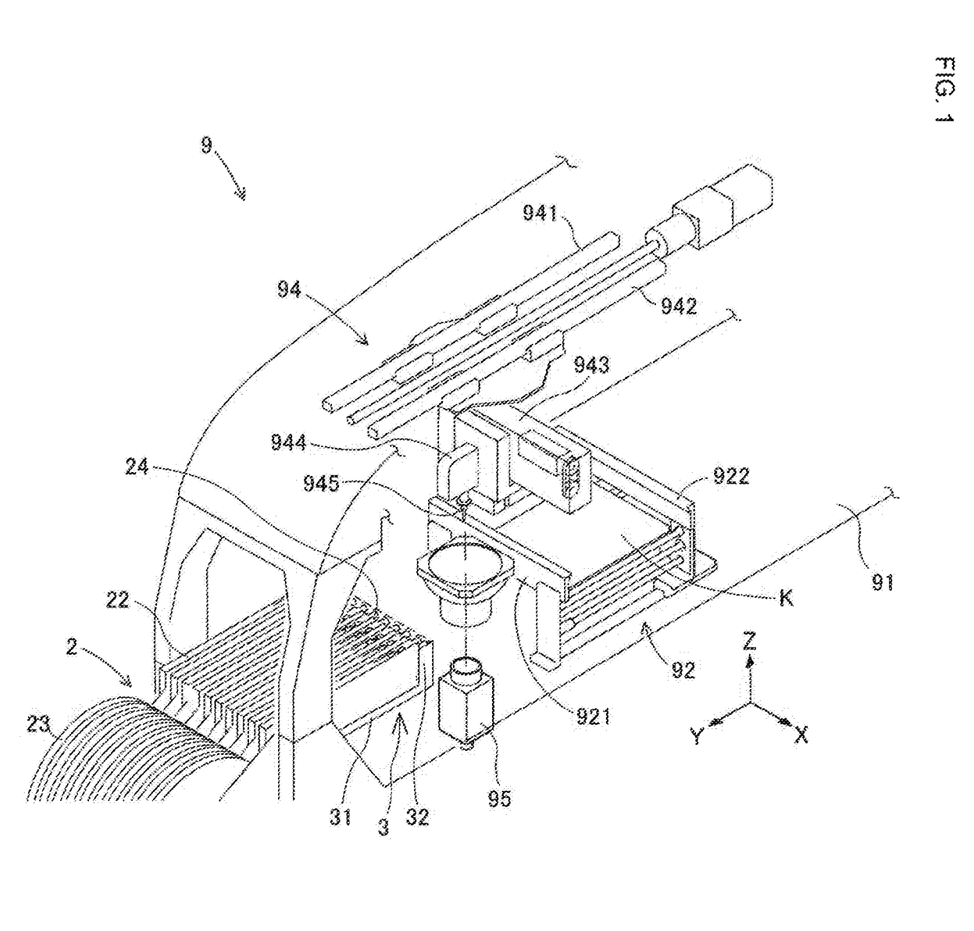
FIG. 1 is a perspective view showing the overall configuration of a component mounter equipped with an electric power supply device that is a first embodiment of the present disclosure.

A first embodiment of the present disclosure, electric power supply device 1, is described below with reference to FIGS. 1 to 7. FIG. 1 is a perspective view showing the overall configuration of a component mounter equipped with an electric power supply device that is a first embodiment of the present disclosure. In FIG. 1, the direction from the left rear to the front right in which board K is loaded and unloaded is the X-axis direction, the direction from the right rear to the front left is the Y-axis direction, and the vertical direction is the Z-axis direction. Component mounter 9 is configured from board conveyance device 92, multiple feeder devices 2, pallet member 3, component transfer device 94, component camera 95, and control device 96 (refer to FIG. 2) assembled on base 91. Board conveyance device 92, feeder devices 2, component transfer device 94, and component camera 95 are controlled from control device 96 such that each performs specified work.

Board conveyance device 92 loads board K to a mounting position, fixes board K in position, and unloads board K. Board conveyance device 92 is configured from items such as first and second guide rails 921 and 922, a pair of conveyor belts, and a clamping device. First and second guide rails 921 and 922 extend in the conveyance direction (X-axis direction) crossing the central upper portion of base 91, and are assembled on base 91 so as to be parallel to each other. A pair of conveyor belts (not shown) are arranged facing each other on the inside of first and second guide rails 921 and 92. The pair of conveyor belts revolve with both edges of board K in contact with the conveyance surface of the conveyor belts and load/unload board K to/from a mounting position set in a center section of base 91. A clamping device (not shown) is provided below the conveyor belts at the mounting position. The clamping device pushes up board K and clamps it in a horizontal state so as to fix it at the mounting position. This allows component transfer device 94 to perform mounting operation at the mounting position.

The multiple feeder devices 2 each consecutively supply electronic components. Feeder device 2 is flat and thin in the width direction (X-axis direction), and extends out in the vertical direction (Z-axis direction) and front-rear direction (Y-axis direction). Multiple feeder devices 2 are loaded in a line on the top surface of pallet member 3 in the width direction (X-axis direction). Each feeder device 2 includes main body section 22, supply reel 23 provided on the rear section of main body section 22, and component takeout section provided at the front edge of main body section 22. Long thin tape (not shown) in which many electronic components are housed at a specified pitch is wound around and held by supply reel 23. This tape is indexed at the specified pitch each time by a mechanism section (not shown) such that the electronic components are exposed and consecutively supplied to component takeup section 24. Feeder device 2 includes motor 46 (refer to FIG. 2) in the mechanism section, and further includes component supply control section 44 (refer to FIG. 2) that controls operation of motor 46.

Pallet member 3 is for loading multiple feeder devices 2, and is detachably held on the top surface of base 91. Pallet member 3 is a component of the main body of component mounter 9, and is formed from bottom plate section 31 and front plate section 32. Bottom plate section 31 is a rectangular plate with a width dimension (dimension in the X-axis direction) smaller than the width dimension of base 91. Multiple positioning sections that define the loading position of feeder device 2 are provided on the upper surface of bottom plate section 31. The positioning sections engage with an engaging section provided on the bottom surface of feeder device 2. As an example of a combination of positioning section and engaging section, a groove-shaped slot extending the Y-axis direction and a protruding section that is inserted into the slot may be considered. Front plate section 32 is established on the front edge of bottom plate section 31. Feeder device 2 is loaded contacting bottom plate section 31 and front plate section 32 of pallet member 3.

Component transfer device 94 picks up a component from component take-out section 24 of each feeder device 2, moves the component to board K held at a fixed position and mounts the component on the board K. Component transfer device 94 is an XY robot type device that is capable of moving horizontally in the X-axis direction and the Y-axis direction. Component transfer device 94 is configured from pair of Y-axis rails 941 and 942, Y-axis slider 943, head holding section 944, suction nozzle 945, and the like. The pair of Y-axis rails 941 and 942 extend in the lengthwise direction of base 91 (the Y-axis direction), and are provided above board conveyance device 92 and feeder device 2. Y-axis slider 943 is mounted on Y-axis rails 941 and 942 so as to be movable in the Y-axis direction. Head holding section 944 is mounted on Y-axis slider 943 so as to be movable in the X-axis direction. Head holding section 944 is driven horizontally in two directions (X-axis direction and Y-axis direction) by two servo motors. Suction nozzle 945 is exchangeably held on the lower surface head holding section 944. Suction nozzle 945 has a pickup opening at the lower end and picks up an electronic component at the pickup opening using negative pressure.

Component camera 95 is provided facing upwards on an upper surface of base 91 between board conveyance device 92 and component supply device 93. Component camera 95 detects the state of a picked up component by imaging the component as it is moved from feeder device 2 to above board K by suction nozzle 945. After component camera 95 detects the deviation in the pickup position and rotation and so on of the component, control device 96 performs fine adjustments of component mounting operation as necessary, and rejects components for which mounting is difficult.

Control device 96 is provided on base 91. Control device 96 stores a mounting sequence that defines the order of electronic components to be mounted on board K and the feeder devices 2 that supply the electronic components. Control device 96 controls component mounting operations according to the mounting sequence and based on imaging data of component camera 95, detection data of sensors that are not shown, and the like. Also, control device 96 sequentially collects and updates operating data such as production quantity of completed boards K, mounting time required to mount the electronic components, and occurrences of component pickup errors.

Figure 2:
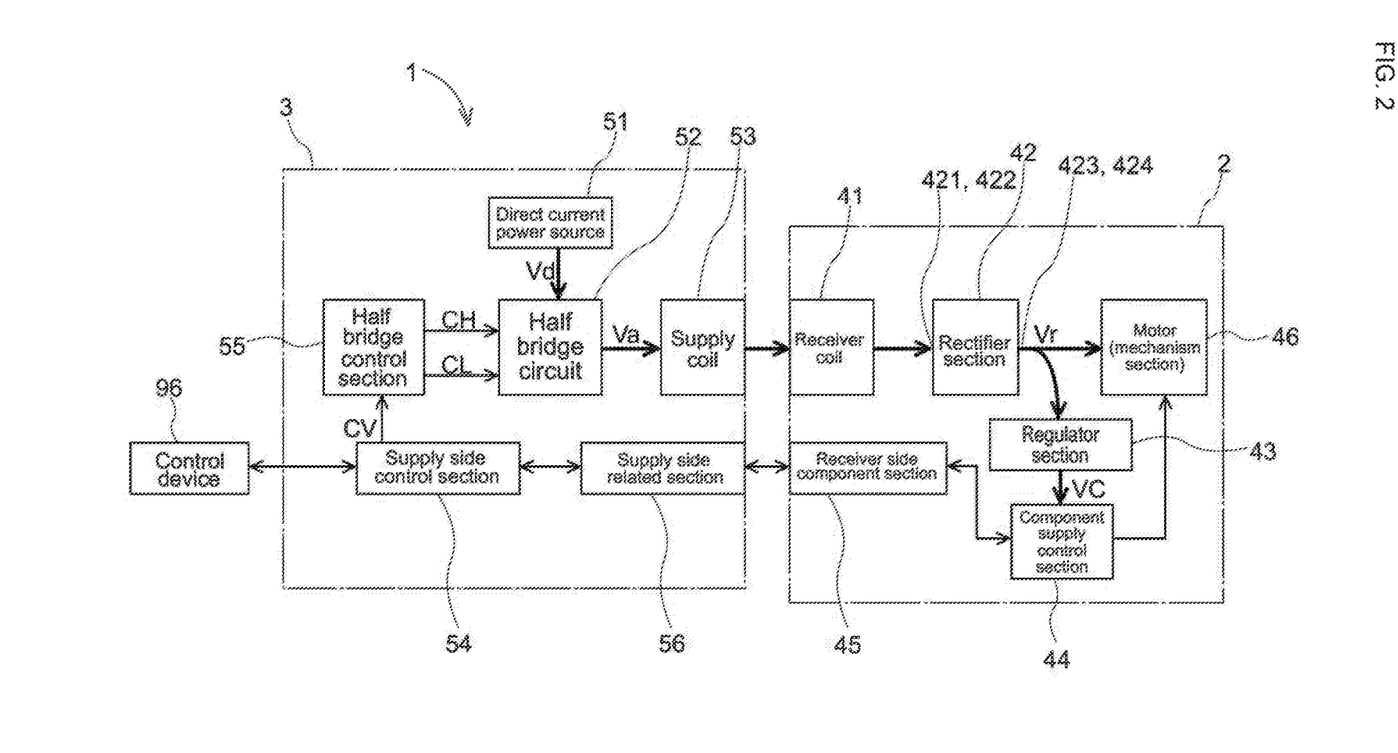
FIG. 2 is a block diagram showing the configuration of the electric power supply device of the first embodiment.

Turning to a description of the first embodiment of electric power supply device 1. The embodiment of electric power supply device 1 is a device that supplies electric power in a contactless manner from pallet member 3 to feeder device 2. Pallet member 3 corresponds to the supply side device of the present disclosure, the main body of the board work machine, and the main body of component mounter 9. On the other hand, feeder device 2 corresponds to the receiver side device of the present disclosure, the loading device, and the component supply device. FIG. 2 is a block diagram showing the configuration of the electric power supply device of the first embodiment. In FIG. 2, a range corresponding to one feeder device 2 is shown by a single dotted line. The thick arrows in FIG. 2 represent the flow of electric power, and the thin arrows represent the flow of information and control.

Feeder device 2 includes, as configuration elements of electric power supply device 1, receiver coil 41, rectifier section 42, regulator section 43, and receiver side related section 45. Also, feeder device 2 includes component supply control section 44 and motor 46 as electric loads to which electric power is supplied. Pallet member 3 includes, as configuration elements of electric power supply device 1, direct current power source 51, half-bridge circuit 52, supply coil 53, supply side control section 54, half bridge control section 55, and supply side related section 56. Supply coil 53 and receiver coil 41 are an electromagnetic coupling type contactless electric power supply element and a contactless electric power reception element. Supply coil 53 and receiver coil 41 may be replaced by another type of element, such as a pair of elements for electrostatic coupling.

Direct current power source 51 on the pallet member 3 side is connected to both ends of half-bridge circuit 52, and supplies specified direct current voltage Vd. An example of direct current power source 51 is a rectifier type electric power source device that uses a commercial frequency current and outputs a rectified current.

Figure 3:
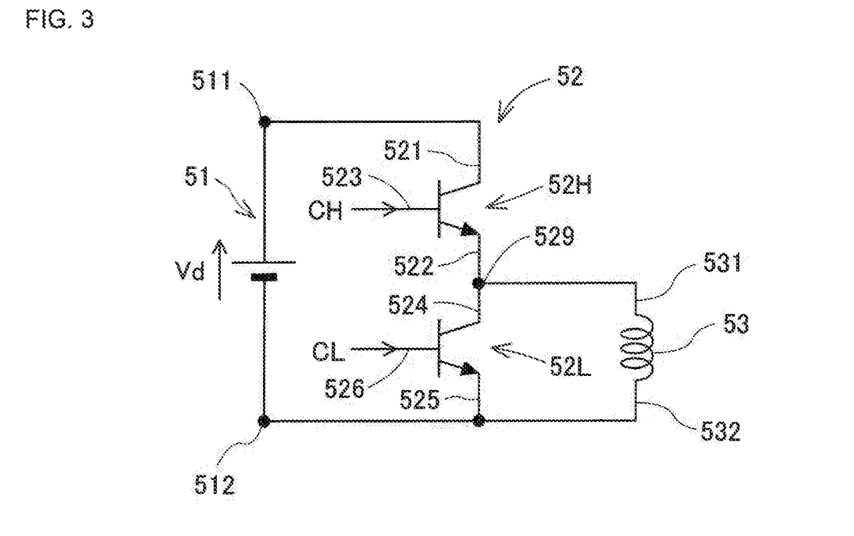
FIG. 3 is a circuit diagram showing a half-bridge circuit.

FIG. 3 is a circuit diagram showing half-bridge circuit 52. Half-bridge circuit 52 is configured of high voltage side switching element 52H and low voltage side switching element 52L connected in series and sandwiching output terminal 529. In detail, with high voltage side switching element 52H, positive side terminal 521 is connected to positive side terminal 511 of direct current power source 51, load side terminal 522 is connected to output terminal 529, and control terminal 523 is connected to half-bridge control section 55. On the other hand, with low voltage side switching element 52L, positive side terminal 524 is connected to output terminal 529, load side terminal 525 is connected to load side terminal 512 of direct current power source 51, and control terminal 526 is connected to half-bridge control section 55. Also, output terminal 529 is connected to an end, that is 531, of supply coil 53, and load side terminal 525 of low voltage switching element 52L is connected to the other end, that is 532, of supply coil 53. Direct current power source 51 and half-bridge circuit 52 correspond to the supply voltage adjusting section of the present disclosure.

Supply coil 53 is formed by a conductor being wound around a C-type core, an E-type core, or the like a specified number of times. Supply coil 53 may be configured using known technology. Note that, a resonance capacitor may be connected in parallel or in series to supply coil 53 to configure a resonance circuit. The above core and resonance capacitor are not required elements.

Supply side control section 54 exchanges information with component supply control section 44 via supply side related section 56 and receiver side related section 45. Also, supply side control section 54 exchanges information with control device 96 that corresponds to the upper control section of the present disclosure. Supply side control section 54 exchanges information related to operation of motor 46, so as to grasp the mechanism operating time period during which motor 46 of each feeder device 2 may operate. Also, supply side control section 54 sets the time period other than the mechanism operating time period as the control operating time period.

Further, supply side control section 54 sends a different voltage setting command CV to half-bridge control section 55 for the mechanism operating time period and the control operating time period. For example, there may be two voltage setting commands CV, "High" for the mechanism operating time period, and "Low" for the control operating time period. Supply side control section 54 may be configured to include a CPU that operates software.

In the first embodiment, the time period in which motor 46 of each feeder device 2 operates is controlled largely by control device 96. Control device 96 grasps the feeder device 2 from which an electronic component is picked up by suction nozzle 945 from component takeout section 24 based on the progress of the mounting sequence being performed. Based on this, control device 96 sends component supply operation command information with respect to a feeder device 2 for which electronic components at component takeout section 24 have run out. This command information is relayed by supply side control section 54 and transmitted to component supply control section 44 via supply side related section 56 and receiver side related section 45. Component supply control section 44 operates motor 46 according to the command information so as to perform component supply operation. In this manner, supply side control section 54 is able to grasp the mechanism operating time period of the feeder device 2 based on the relayed command information.

Not being restricted to the above, there are various methods of controlling the time period in which motor 46 operates. For example, a sensor that detects the presence of an electronic component at component takeout section 24 may be provided, and when electronic components run out, component supply control section 44 may autonomously cause motor 46 to operate. In this manner, supply side control section 54 is able to grasp the mechanism operating time period of the feeder device 2 by receiving information regarding operating motor 46 from component supply control section 44.

Further, for example, the configuration may be such that component supply control section operates motor 46 based on a predetermined time schedule. In this manner, supply side control section 54 is able to grasp the mechanism operating time period of the feeder device 2 based on the shared time schedule. Thus, information exchange between supply side control section 54 and component supply control section 44, and information exchange between supply side control section 54 and control device 96, are not essential.

Half-bridge control section 55 functions as a portion of supply side control section 54. Half-bridge control section 55 variably controls the occurrence frequency of high voltage side control signal CH and low voltage side control signal CL according to voltage setting commands CV. Half-bridge control section 55 outputs high voltage side control signal CH to control terminal 523 of high voltage side switching element 52H of half-bridge circuit 52. In a similar manner, half-bridge control section 55 outputs low voltage side control signal CL to control terminal 526 of low voltage side switching element 52L of half-bridge circuit 52.

Figure 4:
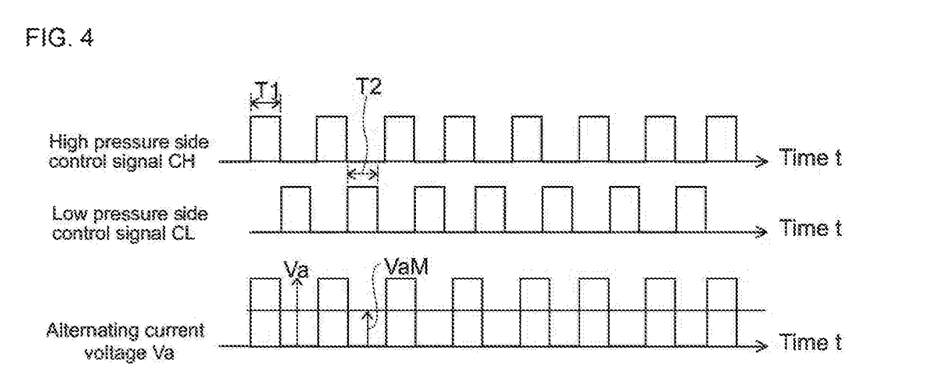
FIG. 4 shows graphs of the waveforms of the high voltage side control signal and the low voltage side control signal output by the half-bridge control section during the mechanism operating time period.
Figure 5:
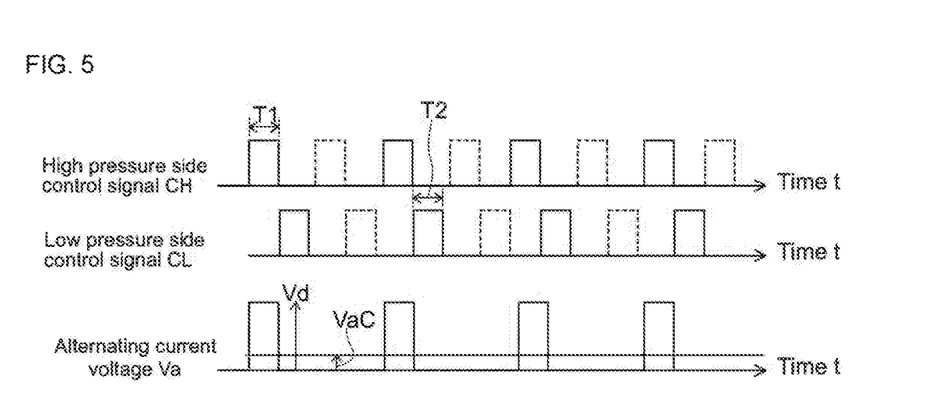
FIG. 5 shows graphs of the waveforms of the high voltage side control signal and the low voltage side control signal output by the half-bridge control section during the control operating time period.

FIG. 4 shows graphs of the waveforms of high voltage side control signal CH and low voltage side control signal CL output by half-bridge control section 55 during the mechanism operating time period. Further, FIG. 5 shows graphs of the waveforms of high voltage side control signal CH and low voltage side control signal CL output by half-bridge control section 55 during the control operating time period. The horizontal axis in FIGS. 4 and 5 is the same time axis t. Also, in FIGS. 4 and 5, the upper section shows high voltage side control signal CH, the middle section shows low voltage side control signal CL, and the lower section shows alternating current voltage Va output from half-bridge circuit 52 and applied to supply coil 53.

As shown in FIG. 4, half-bridge control section 55 alternately and exclusively issues high voltage side control signal CH and low voltage side control signal CL During signal continuation time T1 during which high voltage side control signal CH is being issued, there is a conductance state between positive side terminal 521 and load side terminal 522 of high voltage side switching element 52H. Also, during signal continuation time T1, low voltage side signal CL is not issued, and there is a cutoff state between positive side terminal 524 and load side terminal 525 of low voltage side switching element 52L. At this time, supply coil 53 is in a state with direct current voltage Vd being applied between terminals 531 and 532.

Conversely, during signal continuation time T2 during which low voltage side control signal CL is being issued, high voltage side control signal CH is not issued. During signal continuation time T2, high voltage side switching element 52H is in a cutoff state, and low voltage side switching element 52L is in a conductive state. At this time, supply coil 53 is cut off from direct current power source 51 and is in a state of no voltage with terminals 531 and 532 being shorted. Accordingly, supply coil 53 alternates between a state in which direct current voltage Vd is applied and a state of no voltage, that is, a state in which alternating current voltage Va is applied.

Further, during the mechanism operating time period, half-bridge control section 55 receives "High" for the voltage setting command CV and controls the occurrence frequency of high voltage side control signal CH and low voltage side control signal CL to be highest, as shown in FIG. 4. By this, the average value VaM of alternating current voltage Va allied to supply coil 53 during the mechanism operating time period is just under half direct current voltage Vd. Also, during the control operating time period, half-bridge control section 55 receives "Low" for the voltage setting command CV and controls the occurrence frequency of high voltage side control signal CH and low voltage side control signal CL to be lower than that during the mechanism operating time period. In the example of FIG. 5, the waveforms of high voltage side and low voltage side control signals CH and CL miss out every other peak with respect to the waveforms of FIG. 4. By this, the occurrence frequency of alternating current voltage Va applied to supply coil 53 during the control operating time period is halved, and the average value VaC is reduced to around half of average value VaM during the mechanism operating time period.

Receiver coil 41 on the feeder device 2 side is arranged so as to be capable of facing supply coil 53. That is, to match the arrangement of supply coil 53 with respect to front plate section 32 or bottom plate section 31 of pallet member 3, receiver coil is arranged on the front surface or bottom surface of feeder device 2. Receiver coil 41, similar to supply coil 53, is formed by a conductor being wound around a core. However, the winding quantity of receiver coil 41 may be different to the winding quantity of supply coil 53. When feeder device 2 is loaded to the loading position on pallet member 3, supply coil 53 and receiver coil 41 are arranged facing each other. When this occurs, the cores of both 41 and 53 form a good magnetic circuit. By this, receiver coil 41 is able to receive high frequency electric power from supply coil 53 in a contactless manner. Both ends of receiver coil 41 are connected to input terminals 421 and 422 of rectifier section 42.

Rectifier section 42 rectifies the high frequency electric power received by receiver coil 41 into direct current, and outputs the direct current to regulator section 43 and motor 46. Rectifier section 42 may be, for example, a full-wave rectifier in which four diodes are bridge connected, or may be used together with a smoothing circuit. Here, the direct current voltage output from output terminals 423 and 424 of rectifier 42 is received voltage Vr. Received voltage Vr corresponds to the effective voltage of the high frequency electric power received by receiver coil 41. The connection between output terminals 423 and 424 of rectifier section 42, and motor 46 may be direct or may be via an open/close switch such that cutting off is possible. However, note that the connection between output terminals 423 and 424, and regulator section 43 is direct.

Figure 6:
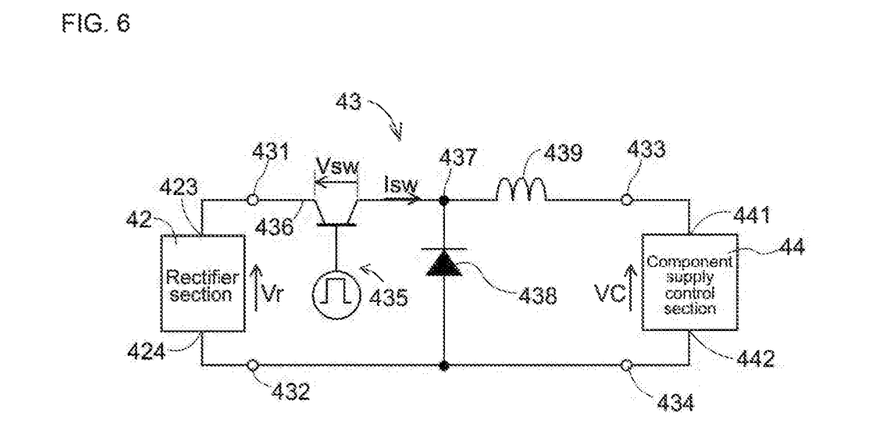
FIG. 6 shows a basic circuit of a regulator section.

Regulator section 43 converts received voltage Vr into control voltage VC and outputs control voltage VC. FIG. 6 shows a basic circuit of regulator section 43. As shown, regulator section 43 is configured from a step-down switching regulator circuit First, the connection method regarding input and output of regulator section 43 is described. Positive side input terminal 431 of regulator section 43 is connected to positive side output terminal 423 of rectifier section 42; load side input terminal 432 is connected to load side output terminal 424 of rectifier section 42. Positive side output terminal 433 of regulator 43 is connected to positive side terminal 441 of component supply control section 44; load side output terminal 434 is connected to load side terminal 442 of component supply control section 44.

Described next is the internal circuit configuration of regulator section 43. Positive side input terminal 431 of regulator section 43 is connected to terminal 436 of switching element 435. Diode 438 is connected between terminal 437 of switching terminal 435 and load side input terminal 432. Diode 438 allows current to flow from load side input terminal 432 to terminal 437 of switching terminal 435 and blocks current in the other direction. Further, coil 439 is connected between terminal 437 of switching terminal 435 and positive side output terminal 433. Coil 439 has a function to smooth the pulse flow output from switching terminal 435. On the other hand, load side input terminal 432 and load side output terminal 434 are connected directly internally.

Next, operations and effects of the first embodiment of electric power supply device 1 configured as above are described. As given above, supply side control section 54 is able to grasp the mechanism operating time period and the control operating period time of each feeder device 2 by relaying command information of component supply operations. Then, during the mechanism operating time period, supply side control section 54 sends "High" as voltage setting command CV to half-bridge control section 55. Half-bridge control section 55 outputs low voltage side control signal CL and high voltage side control signal CH shown in FIG. 4 and for which the occurrence frequency is highest to half-bridge circuit 52. By this, received voltage Vr approximately equals drive voltage VM, thus operation of motor 46 becomes possible. Also, even though received voltage Vr is high, because regulator section 43 outputs control voltage VC after converting the voltage, component supply control section 44 operates.

On the other hand, during the control operating time period, supply side control section 54 sends "Low" as voltage setting command CV to half-bridge control section 55. Half-bridge control section 55 outputs low voltage side control signal CL and high voltage side control signal CH shown in FIG. 5 and for which the occurrence frequency is highest to half-bridge circuit 52. By this, because received voltage is reduced to about half of drive voltage VM, motor 46 becomes unable to operate. Also, because regulator section 43 outputs control voltage VC after converting the relatively low voltage received voltage Vr, component supply control section 44 operates. At this time, command information of component supply operation is not sent to feeder device 2, so there is no problem with motor 46 not operating.

Figure 7:
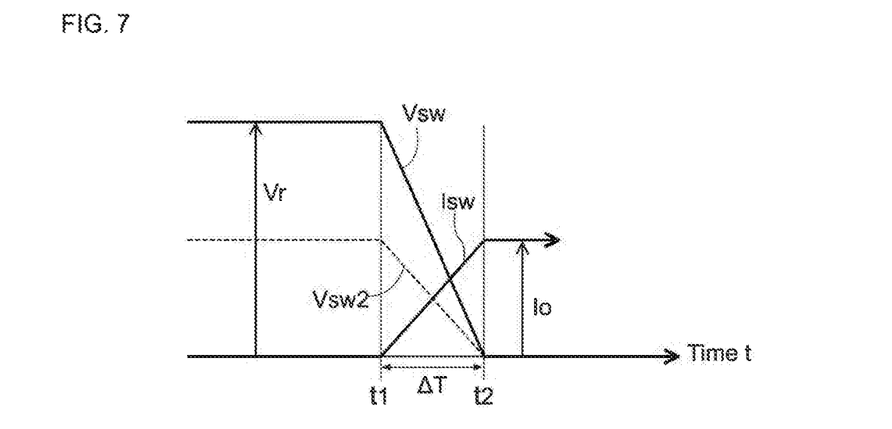
FIG. 7 schematically shows the change in the element voltage and element current when the state of the switching element of the regulator section changes from a cutoff state to a conducting state.

Here, we should pay attention to loss Wt that occurs during switching operation of regulator section 43. FIG. 7 schematically shows the change in element voltage Vsw and element current Isw when the state of switching element 435 of regulator section 43 changes from a cutoff state to a conducting state. In FIG. 7, switching time Δt is the period from starting time t1 to finishing time t2. Element voltage Vsw is the voltage that occurs between terminal 436 and terminal 437 of switching element 435 (refer to FIG. 6); element current Isw is the current flowing from terminal 436 towards terminal 437 (refer to FIG. 6). Here, element voltage Vsw and element current Isw during switching operation are shown schematically changing simply in a straight line manner. Also, element voltage Vsw, which is a solid line in FIG. 7, is during the mechanism operating time period; element voltage Vsw2, which is a dashed line in FIG. 7, is during the control operating time period.

Before starting time t1, switching element 435 is considered to be in a completely cutoff state. Thus, element voltage Vsw is the same as received voltage Vr and element current Isw is zero. During switching time Δt, the resistance value of switching element 435 can be thought of as changing. That is, at starting time t1, when the resistance value reduces from infinity to a finite value, element current Isw starts to flow and element voltage Vsw start reducing. Further, as time elapses the resistance value reduces, element current Isw increases, and element voltage Vsw reduces. Then, at finishing time t2, switching element 435 is considered to be in a completely conductive state. At this time, element voltage Vsw is zero, and element current Isw becomes a largely fixed current Io, which is dependent on the load resistance value of component supply control section 44. Accordingly, loss Wt that occurs due to the change in element voltage Vsw and element current Isw is calculated as follows (equation 1).
Equation 1

$$Wt = \int_{t1}^{t2} Vsw \cdot Isw \, dt$$
$$= \frac{1}{6} \cdot Vr \cdot Io \cdot \Delta T$$

In equation 1, loss Wt is a function of received voltage Vr output from rectifier section 42. Accordingly, when received voltage Vr drops as shown by the dashed line in FIG. 7, loss Wt of regulator section 43 decreases proportionately. In reality, element voltage Vsw and element current Isw change in a non-linear manner, but qualitatively speaking, it is a fact that loss Wt decreases. Therefore, loss Wt of regulator section 43 during the control operating time period is reduced more than with conventional technology, for which received voltage Vr is not reduced.

Note that the occurrence frequency of high voltage side control signal CH and low voltage side control signal CL during the control operating time period is not limited to being controlled to be reduced by half, the occurrence frequency may be controlled to be reduced by one third or one quarter or the like. The purpose of performing control so as to lower the occurrence frequency is to variably adjust average value Vac of alternating current voltage Va of supply coil 53 so as to adjust received voltage Vr. Therefore, from this point of view, it is possible to set the occurrence frequency to a suitable value such that received voltage Vr is reduced to approximately be the same as control voltage VC. At this time, because regulator section 43 does not have a function to raise the voltage, it is not desirable to lower received voltage Vr below control voltage VC. Hypothetically, in a case in which a regulator section with a raising function was used, loss Wt would increase as received voltage Vr became smaller than control voltage VC43. That is, making received voltage Vr be the same as control voltage VC during the control operating time period is ideal and enables loss Wt to be minimized.

Electric power supply device 1 of the first embodiment is for supplying electric power from pallet member 3 (supply side device) to feeder device 2 (receiver side device) including motor 46 (mechanism section) that operates intermittently with drive voltage VM and component supply control section 44 (receiver side control section) that controls an operation of motor 46 with control voltage VC that is lower than drive voltage VM, electric power supply device 1 including: regulator section 43, which is provided on feeder device 2, that converts received voltage Vr received via an electric power supply into control voltage VC; direct current power source 51 and half-bridge circuit 52 (supply voltage adjusting section), which are provided on pallet member 3, that adjustably supply received voltage Vr; and supply side control section 54 and half-bridge control section 55, which are provided on pallet member 3, that control received voltage Vr by controlling half-bridge circuit 52; wherein supply side control section 54 grasps a mechanism operating time period for which operation of motor 46 is possible, allows operation of motor 46 during the mechanism operating time period by approximately matching received voltage Vr to drive voltage VM, and lowers received voltage Vr below drive voltage VM for a control operation time period, which is a time period except for the mechanism operating time period.

According to this, supply side control section 54 allows operation of motor 46 during the mechanism operating time period by approximately matching received voltage Vr to drive voltage VM, and lowers received voltage Vr below drive voltage VM for a control operation time period, which is a time period except for the mechanism operating time period. Therefore, for the mechanism operating time period, during which motor 46 may operate, feeder device 2 receives high received voltage Vr approximately the same as drive voltage VM, meaning that motor 46 and component supply control section 44 operate reliably. On the other hand, during the control operating time period, during which motor 46 does not operate, feeder device 2 receives low received voltage Vr, such that component supply control section 44 operates reliably. Here, because the difference between received voltage Vr and control voltage VC is small during the control operating time period, the converting efficiency of regulator 43 improves, and the electric power loss and temperature increase of feeder device 2 are effectively reduced. Further, due to the temperature increase being effectively decreased, the cooling configuration of heat dissipation fins and the like can be simplified, and feeder device 2 can be made smaller and lighter.

Further, electric power supply device 1 of the first embodiment is also provided with supply side related section 56 and receiver side related section 45 (control related section) that causes information related to the operation of motor 46 to be exchanged between component supply control section 44 and supply side control section 54, and supply side control section 54 grasps the mechanism operating time period by information exchange with component supply control section 44 via supply side related section 56 and receiver side related section 45.

Accordingly, supply side control section 54 is able to grasp the mechanism operating time period by receiving information regarding operating motor 46 from component supply control section 44. Therefore, at any moment at which motor 46 operates, feeder device 2 is certainly able to receive high received voltage Vr, meaning that operational reliability is extremely high.

Further, with electric power supply device 1 of the first embodiment, supply side control section 54 causes received voltage Vr to approximately match control voltage VC during the control operating time period.

Accordingly, loss Wt of regulator section 43 during the control operating time period is minimized, meaning that the effects of reducing electric power loss and temperature increase in feeder device 2 are remarkable.

Further, electric power supply device 1 of the first embodiment is also provided with a supply coil 53 (contactless electric power supply element) connected to half-bridge circuit 52, and receiver coil 41 (contactless electric power reception element) connected to regulator section 43 via rectifier section 42, and contactless electric power supply using high frequency alternating current is performed when supply coil 53 and receiver coil 41 are arranged facing each other.

Accordingly, the effects of reducing electric power loss and temperature increase are remarkable for feeder device 2 supplied with electric power by electric power supply device 1 via contactless electric power supply.

Further, with electric power supply device 1 of the first embodiment, the supply voltage adjusting section includes half-bridge circuit 52 in which high voltage side switching element 52H and low voltage side switching element 52L are connected in series sandwiching output terminal 529, direct current power source 51 is connected to both ends of half-bridge circuit 52, output terminal 529 is connected to terminal 531 of supply coil 53, and supply side control section 54 includes half-bridge control section 55. Half-bridge control section 55 issues alternately and exclusively high voltage side control signal CH that passes through high voltage side switching element 52H and low voltage side control signal CL that passes through low voltage side switching element 52L, and variably controls the occurrence frequency of high voltage side control signal CH and low voltage side control signal CL.

Accordingly, using half-bridge circuit 52, it is possible to variably adjust average value Vac of alternating current voltage Va of supply coil 53, enabling received voltage Vr received by feeder device 2 to be adjusted variably. Half-bridge circuit 52 and half-bridge control section 55 are cheap and have a simple circuit configuration, contributing to lower costs for pallet member 3.

Further, with electric power supply device 1 of the first embodiment, half-bridge control section 55 makes signal continuation times T1 and T2 a constant, controls the occurrence frequency to be high during the mechanism operating time period, and controls the occurrence frequency to be low during the control operating time period.

Accordingly, by performing control to make the occurrence frequency of high voltage side control signal CH and low voltage side control signal CL low, it is possible to variably adjust average value Vac of alternating current voltage Va of supply coil 53, enabling received voltage Vr received by feeder device 2 to be adjusted variably. Control to make the occurrence frequency low can be performed by a control circuit with a simple configuration compared to, for example, a method of variably controlling signal continuation times T1 and T2 by pulse width modulation. In addition, by making the occurrence frequency low by one half, one third, one quarter, and so on as appropriate, received voltage Vr is approximately the same as control voltage VC, and loss Wt of regulator section 43 can be minimized. Thus, this contributes greatly to lowering the cost of pallet member 3, giving excellent cost performance.

Further, with electric power supply device 1 of the first embodiment, the supply side device is a main body of a board work machine that performs specified work on board K, and the receiver side device is a loading device that is loaded on the board work machine. In addition, the main body of the board work machine is pallet member 3 that comes with a main body of component mounter 9 that mounts electronic components on board K, the loading device is multiple feeder devices 2 that are detachably loaded on component mounter 9 and that supply electronic components, the mechanism section includes motor 46, and the receiver side control section is component supply control section 44 that controls an operation of motor 46.

Accordingly, by electric power supply device 1 of the first embodiment being built in to the board work machine, specifically, component mounter 9, effects of reducing electric power loss and temperature increase for feeder device 2 are remarkable.

Further, with electric power supply device 1 of the first embodiment, control device 96 (upper control section) provided on the main body of the component mounter sends various command information for operating each motor 46 of the multiple feeder devices 2 to each component supply control section 44 via supply side control section 54 based on the progress of the mounting sequence that indicates the mounting order of the electronic components and the feeder devices 2 that supply the electronic components, and supply side control section 54 grasps the mechanism operating time period of each motor 46 of the multiple feeder devices 2 based on each piece of the command information.

Thus, supply side control section 54 is able to grasp the mechanism operating time period of the feeder devices 2 based on the relayed command information. Therefore, at any moment at which motor 46 operates, feeder device 2 is certainly able to receive high received voltage Vr, meaning that operational reliability is extremely high.

Figure 8:
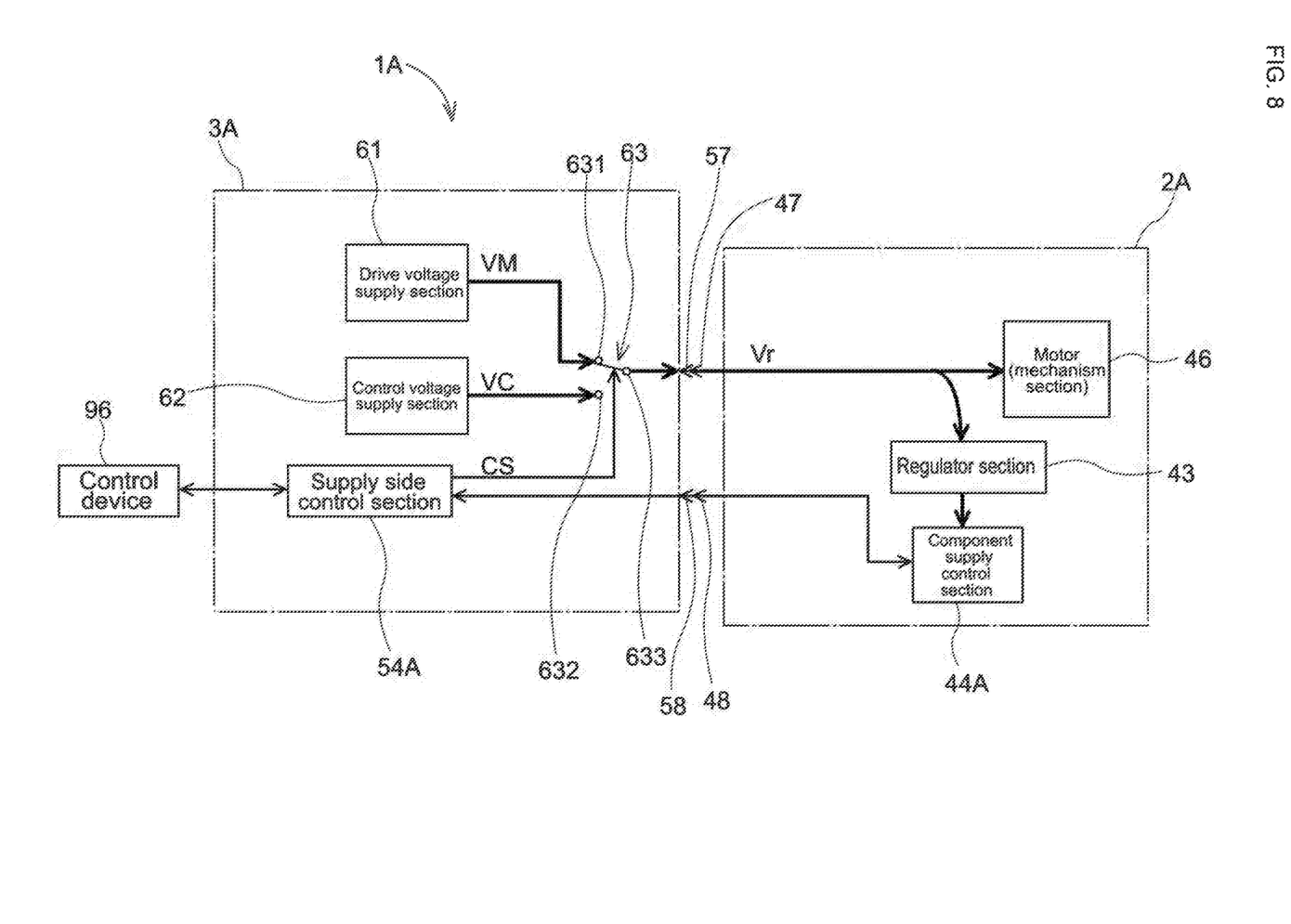
FIG. 8 is a block diagram showing the configuration of the electric power supply device of a second embodiment.

Next, with reference to FIG. 8, descriptions are given with regard to a second embodiment, electric power supply device 1A, that performs contact-type electric power supply, descriptions mainly relating to points that are different to the first embodiment. For the second embodiment, the overall configuration of component mounter 9 equipped with electric power supply device 1A is the same as with the first embodiment. FIG. 8 is a block diagram showing the configuration of electric power supply device 1A of the second embodiment. In FIG. 8, a range corresponding to one feeder device 2A is shown by a single dotted line. The thick arrows in FIG. 8 represent the flow of electric power, and the thin arrows represent the flow of information and control.

Feeder device 2A includes regulator section 43 and receiver terminal 47 as configuration elements of electric power supply device 1A, and further includes motor 46 and component supply control section 44A. On the other hand, pallet member 3A includes, as configuration elements of electric power supply device 1A, drive voltage supply section 61, control voltage supply section 62, supply side control section 54A, power supply switching switch 63, and power supply terminal reception section 57.

Drive voltage supply section 61 on the pallet member 3A side is a direct current power source and supplies direct current approximately the same as drive voltage VM to first input terminal 631 of power supply switching switch 63. Control voltage supply section 62 is a direct current power source and supplies direct current approximately the same as control voltage VC to second input terminal 632 of power supply switching switch 63. Drive current voltage supply section 61 and control voltage supply section 62 configure the supply voltage adjusting section of the present disclosure.

Power supply switching switch 63 functions as a portion of supply side control section 54A. Power supply switching switch 63 switchably and selectively connects either first input terminal 631 or second input terminal 632 to output terminal 633. Output terminal 633 is connected to power supply terminal reception section 57. Switching operation of power supply switching switch 63 is controlled by control signal CS from supply side control section 54A. Supply terminal reception section 57 and related terminal reception section 58 are collected in one connector reception section and arranged on front plate section 32 of pallet member 3A.

Supply side control section 54A exchanges information with component supply control section 44A on the feeder device 2A side via related terminal reception section 58 and related terminal 48, and exchanges information with control device 96 on the main body side. Supply side control section 54A, in a similar manner to the first embodiment, grasps the mechanism operating time period of the feeder device 2A by receiving command information of component supply operations from control device 96 to component supply control section 44A. Also, supply side control section 54A sets the time period other than the mechanism operating time period as the control operating time period.

Further, supply side control section 54A sends control signal CS to power supply switching switch 63 based on the mechanism operating time period and the control operating time period. That is, supply side control section 54A connects first input terminal 631 to output terminal 633 during the mechanism operating time period, and connects second input terminal 632 to output terminal 633 during the control operating time period.

Receiver terminal 47 and related terminal 48 of the feeder device 2A side are collected as one multi-terminal connector, and are arranged on the front surface of feeder device 2A. When feeder device 2A is loaded to the loading position on pallet member 3A, the multi-terminal connector of feeder device 2A is inserted into a connector reception section of pallet member 3A. By this, power supply terminal reception section 57 and receiver terminal 47 are connected and contact-type electric power supply is possible. Here, the voltage received by receiver terminal 47 is received voltage Vr. Also, related terminal reception section 58 and related terminal 48 are connected, and information is able to be exchanged between supply side control section 54A and component supply control section 44A.

Receiver terminal 47 is connected to regulator section 43 and motor 46. Receiver terminal 47 and motor 46 may be connected directly, or may be connected via an open/close switch that enables power to be cut. Also, receiver terminal 47 is directly connected to regulator section 43. The internal circuit configuration of regulator section 43 is the same as the first embodiment as shown in FIG. 6.

Next, operations and effects of the second embodiment of electric power supply device 1A configured as above are described. As given above, supply side control section 54A grasps the mechanism operating time period and the control operating time period of each feeder device 2A, and controls power supply switching switch 63. By this, during the mechanism operating time period, first input terminal 631 of power supply switching switch 63 is connected to output terminal 633, and direct current voltage approximately the same as drive voltage VM of drive voltage supply section 61 is output from power supply terminal reception section 57. At this time, feeder device 2A receives drive voltage VM as received voltage Vr. Also, during the mechanism operating time period, second input terminal 632 of power supply switching switch 63 is connected to output terminal 633, and direct current voltage approximately the same as control voltage VC of control voltage supply section 62 is output from power supply terminal reception section 57. At this time, feeder device 2A receives control voltage VC as received voltage Vr.

When this occurs, loss Wt of regulator section 43 during the control operating time period, similar to as described with the first embodiment, is reduced more than with conventional technology, for which received voltage Vr is not reduced. That is, for the contact-type electric power supply of the second embodiment as well, in a similar manner to the contactless electric power supply of the first embodiment, electric power loss and temperature increase in feeder device 2A are effectively reduced.

Figure 9:
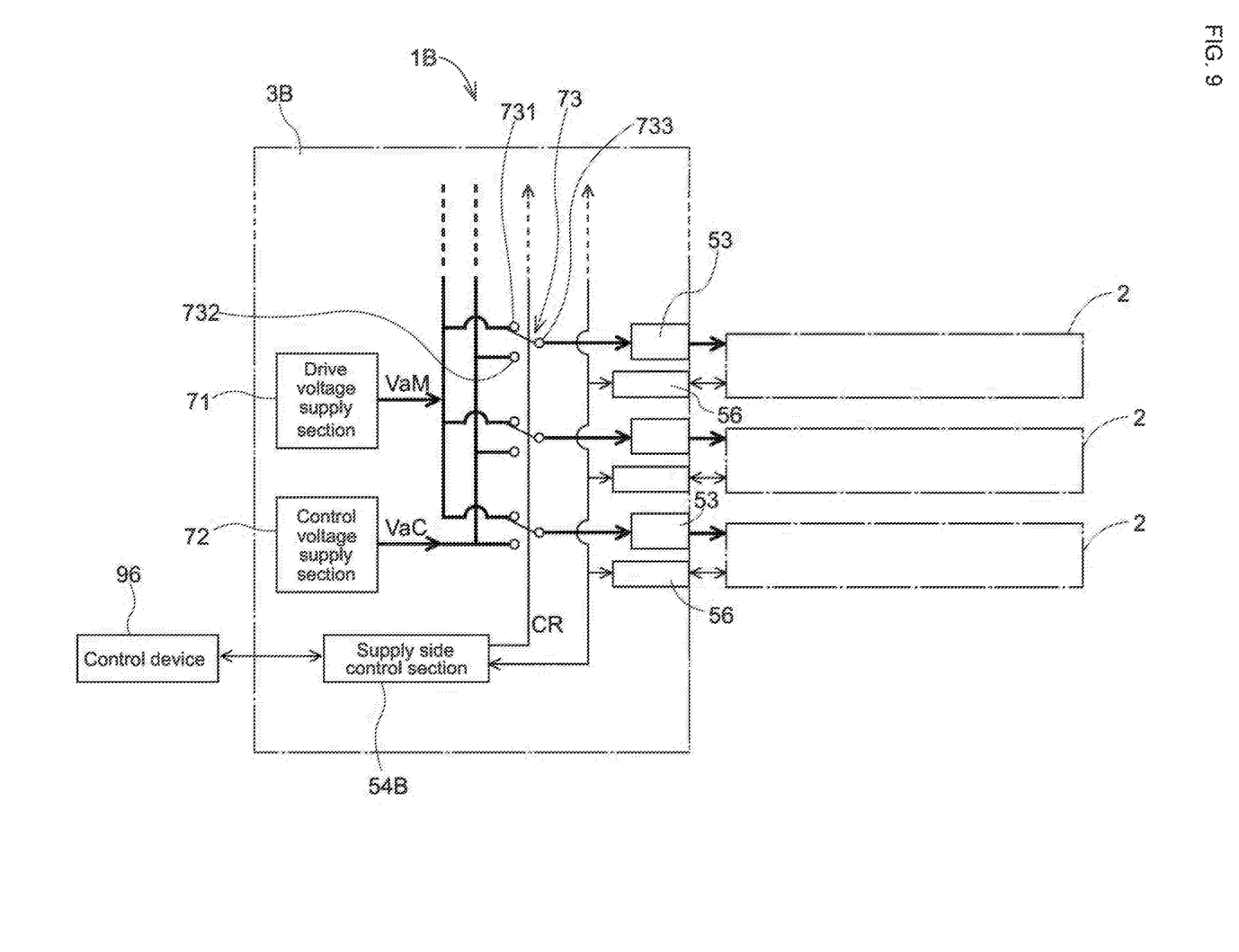
FIG. 9 is a block diagram showing the configuration of the electric power supply device of a third embodiment.

Next, with reference to FIG. 9, descriptions are given with regard to a third embodiment, electric power supply device 1B, descriptions mainly relating to points that are different to the first and second embodiments. For the third embodiment, the overall configuration of component mounter 9 equipped with electric power supply device 1B is the same as with the first embodiment. FIG. 9 is a block diagram showing the configuration of electric power supply device 1B of the third embodiment. In FIG. 9, three feeder devices 2 out of n feeder devices 2 loaded on pallet member 3B are shown by single-dotted lines, with the corresponding range shown by solid lines. The thick arrows in FIG. 9 represent the flow of electric power, and the thin arrows represent the flow of information and control.

Feeder device 2 includes, as configuration elements of electric power supply device 1B, receiver coil 41, rectifier section 42, regulator section 43, and receiver side related section 45. The configuration of feeder device 2 is the same as the first embodiment, so descriptions are omitted. However, pallet member 3B includes, as configuration elements of electric power supply device 1B, drive voltage supply section 71, control voltage supply section 72, supply side control section 54B, n pieces of power supply switching switch 73, and n pieces of supply side related section 56.

Drive voltage supply section 71 on the pallet member 3B side is configured from direct current power source 51, half-bridge circuit 52, and half bridge control section 55 described in the first embodiment. However, half-bridge control section 55 controls the occurrence frequency of high voltage side control signal CH and low voltage side control signal CL always to be highest, without receiving voltage setting command CV. Thus, drive voltage supply section 71 always outputs average value VaM of alternating current voltage Va shown in FIG. 4. The output destination of average value VaM of alternating current voltage Va is across the all of the n pieces of the first input terminal 731 of power supply switching switch 73.

On the other hand, control voltage supply section 72 is also configured from direct current power source 51, half-bridge circuit 52, and described in the first embodiment and half bridge control section 55. However, half-bridge control section 55 controls the occurrence frequency of high voltage side control signal CH and low voltage side control signal CL always to be lowest, without receiving voltage setting command CV. By this, control voltage supply section always outputs average value VaC of alternating current voltage Va shown in FIG. 5 (about half of average value VaM). The output destination of average value VaC of alternating current voltage Va is across the all of the n pieces of the second input terminal 732 of power supply switching switch 73. Drive current voltage supply section 71 and control voltage supply section 72 configure the supply voltage adjusting section of the present disclosure.

The n pieces of power supply switching switch 73 function as a portion of supply side control section 54B. Each power supply switching switch 73 switchably and selectively connects either first input terminal 731 or second input terminal 732 to output terminal 733. Each output terminal 733 is connected one-to-one to n pieces of supply coil 53. Switching operation of power supply switching switches 73 is controlled by control signals CR from supply side control section 64A, with control being performed independently for each.

Supply side control section 54B exchanges information with component supply control section 44 on each feeder device 2 independently for each feeder device 2 via each of the n pieces of supply side related section 56. Supply side control section 54B also exchanges information with control device 96 on the main body side. Supply side control section 54B, in a similar manner to the first and second embodiments, grasps the mechanism operating time period of the n feeder devices 2A by receiving command information of component supply operations from control device 96 to the n component supply control sections 44. Also, supply side control section 54B sets the time period other than the mechanism operating time period for each of the feeder devices 2 as the control operating time period.

Further, supply side control section 54B sends control signal CR individually to each power supply switching switch 73 based on the time period of each of the feeder devices 2. That is, supply side control section 54B, when electric power should be supplied from drive voltage supply section 71 for a feeder device 2 during the mechanism operating time period, connects first terminal 731 of power supply switching switch 73 to output terminal 733 for that feeder device 2. Also, supply side control section 54B, when electric power should be supplied from control voltage supply section 72 for a feeder device 2 during the control operating time period, connects second terminal 732 of power supply switching switch 73 to output terminal 733 for that feeder device 2.

With electric power supply device 1B of the third embodiment configured as above, for feeder devices 2 during the mechanism operating time period, electric power is supplied from drive voltage supply section 71, with received voltage Vr being approximately the same as drive voltage VM. Also, for feeder devices 2 during the control operating time period, electric power is supplied from drive voltage supply section 72, with received voltage Vr being lower than drive voltage VM. Thus, the effects of effectively reducing the electric power loss and temperature increase of each feeder device 2 is similar as that of the first and second embodiments.

Further, with electric power supply device 1B of the third embodiment, there are n (multiple) feeder devices 2 with regulator section 43, the supply voltage adjusting section is configured from drive voltage supply section 71 adjusted such that the received voltage approximately matches the drive voltage and control voltage supply section 72 adjusted such that received voltage Vr is lower than drive voltage VM, and supply side control section 54B causes electric power to be supplied from drive voltage supply section 71 to feeder device 2 during the mechanism operation time period, and causes electric power to be supplied from control voltage supply section 72 to feeder device 2 during the control operating time period.

Accordingly, it is possible to replace n sets of half-bridge circuit 52 and half-bridge control section 55 required to correspond to n feeder devices 2 of the first embodiment with one set of drive voltage supply section 71 and control voltage supply section 72. Accordingly, the configuration on the pallet member 3 side becomes simpler, greatly contributing to reducing the cost of pallet member 3.

Note that with the first embodiment, in order to make received voltage Vr on the feeder device 2 side appropriate, other methods except for making the occurrence frequency of high voltage side control signal CH and low voltage side control signal CL lower may be applied. For example, a method that makes the duty ratio small by shortening signal continuation time T1 of high voltage control signal CH, or a method of controlling direct current voltage Vd of direct current power source 51 may be used to lower average value VaC of alternating current voltage Va of supply coil 53. Further, average value VaC of alternating current voltage Va of supply coil 53 may be lowered by a circuit configuration different to half-bridge circuit 52 and half-bridge control section 55. Even further, the method of voltage conversion of regulator section 43 on the feeder device 2 side may be different. Various other applications and modifications are possible for the present disclosure.

INDUSTRIAL APPLICABILITY

Use of the electric power supply device of the present disclosure is not limited to feeder device 2 or 2A of component mounter 9 described in the embodiments above; use may be applied widely, such as to other types of board work machines and processing machines and assembly machines that produce other goods.

REFERENCE SIGNS LIST 1, 1A, 1B: electric power supply device; 2, 2A: feeder device (receiver side device, loading device); 3, 3A, 3B: pallet member (supply side device, main body of board work machine); 41: receiver coil (contactless receiver terminal); 42: rectifier section; 43: regulator section; 435: switching element; 44: component supply control section (receiver side control section); 45: receiver side related section (control related section); 46: motor; 47: receiver terminal; 48: related terminal; 51: direct current power source; 52: half-bridge circuit; 52H: high voltage side switching element; 52L: low voltage side switching element; 53: supply coil (contactless electric power supply element); 54, 54A, 54B: supply side control section; 55: half-bridge control section; 56: supply side related section (control related section); 57: power supply terminal reception section; 58: related terminal reception section; 61: drive voltage supply section; 62: control voltage supply section; 63: power supply switching switch; 71: drive voltage supply section; 72: control voltage supply section; 73: power supply switching switch; 9: component mounter; 91: base; 92: board conveyance device; 94: component transfer device; 95: component camera; 96: control device

The invention claimed is:

1. An electric power supply device for supplying electric power from a supply side device to a receiver side device including a mechanism section that operates intermittently with a drive voltage and a receiver side control section that controls an operation of the mechanism section with a control voltage that is lower than the drive voltage, the electric power supply device comprising:
   a regulator section, which is provided on the receiver side device, that converts a received voltage received via an electric power supply into the control voltage;
   a supply voltage adjusting section, which is provided on the supply side device, that adjustably supplies the received voltage; and
   a supply side control section, which is provided on the supply side device, that controls the received voltage by controlling the supply voltage adjusting section, a wherein
   the supply side control section determines a mechanism operating time period for operation of the mechanism section, commands the operation of the mechanism section during the mechanism operating time period by approximately matching the received voltage to the drive voltage, and lowers the received voltage below the drive voltage for a control operation time period, which is a time period except for the mechanism operating time period.

2. The electric power supply device according to claim 1, further comprising:
   a control related section that causes information related to the operation of the mechanism section to be exchanged between the receiver side control section and the supply side control section, wherein
   the supply side control section determines the mechanism operating time period by information exchange with the receiver side control section via the control related section.

3. The electric power supply device according to claim 1, wherein
the supply side control section causes the received voltage to approximately match the control voltage during the control operating time period.

4. The electric power supply device according to claim 1, further comprising:
a contactless electric power supply element connected to the adjusting supply voltage section; and
a contactless electric power reception element connected to the regulator section, wherein
contactless electric power supply using high frequency alternating current is performed when the contactless electric power supply element and the contactless electric power receipt element are arranged facing each other.

5. The electric power supply device according to claim 4, wherein
the supply voltage adjusting section includes a half-bridge circuit in which a high voltage side switching element and a low voltage side switching element are connected in series sandwiching an output terminal,
a direct current power source is connected to both ends of the half-bridge circuit, the output terminal is connected to the contactless electric power supply element, and
the supply side control section includes a half-bridge control circuit that issues alternately and exclusively a high voltage side control signal that passes through the high voltage side switching element and a low voltage side control signal that passes through the low voltage side switching element, and that variably controls at least one of an occurrence frequency or a signal continuation time of the high voltage side control signal and the low voltage side control signal.

6. The electric power supply device according to claim 5, wherein
the half-bridge control section makes the signal continuation time a constant, controls the occurrence frequency to be high during the mechanism operating time period, and controls the occurrence frequency to be low during the control operating time period.

7. The electric power supply device according to claim 1, wherein
multiple receiver side devices that have include the regulator section are provided,
the supply voltage adjusting section is configured from a drive voltage supply section adjusted such that the received voltage approximately matches the drive voltage and a control voltage supply section adjusted such that the received voltage is lower than the drive voltage, and
the supply side control section causes electric power to be supplied from the drive voltage supply section to the receiver side device during the mechanism operation time period, and causes electric power to be supplied from the control voltage supply section to the receiver side device during the control operating time period.

8. The electric power supply device according to claim 1, wherein
the supply side device is a main body of a board work machine that performs specified work on a board, and
the receiver side device is a loading device that is loaded on the board work machine.

9. The electric power supply device according to claim 8, wherein
the main body of the board work machine is a main body of a component mounter that mounts electronic components on a board,
the loading device is a component supply device that is detachably loaded on the component mounter and that supplies electronic components,
the mechanism section includes a motor, and
the receiver side control section controls an operation of the motor.

10. The electric power supply device according to claim 9, wherein
an upper control section provided on the main body of the component mounter sends various command information for operating each of the motors of the multiple feeder devices to each receiver side control section via the supply side control section based on a progress of the mounting sequence that indicates a mounting order of the electronic components and the feeder devices that supply the electronic components, and
the supply side control section determines the mechanism operating time period of each of the motors of the multiple feeder devices based on each piece of the command information.

* * * * *